(12) United States Patent
Sato et al.

(10) Patent No.: US 6,844,748 B2
(45) Date of Patent: Jan. 18, 2005

(54) INSPECTION JIG FOR RADIO FREQUENCY DEVICE, AND CONTACT PROBE INCORPORATED IN THE JIG

(75) Inventors: Atsushi Sato, Tokyo (JP); Mitsuhiro Suzuki, Tokyo (JP); Hisashi Suzuki, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 10/714,978

(22) Filed: Nov. 18, 2003

(65) Prior Publication Data

US 2004/0095157 A1 May 20, 2004

(30) Foreign Application Priority Data

Nov. 19, 2002 (JP) ..................................... P. 2002-334985

(51) Int. Cl.$^7$ .............................................. G01R 31/02
(52) U.S. Cl. ....................................... 324/754; 324/761
(58) Field of Search .................... 324/72.5, 754–758, 324/761–762; 439/482, 578

(56) References Cited

U.S. PATENT DOCUMENTS 4,935,696 A * 6/1990 DiPerna ...................... 324/761
6,037,787 A * 3/2000 Corwith ....................... 324/754
6,667,628 B2 * 12/2003 Ahrikencheikh et al. ... 324/754

FOREIGN PATENT DOCUMENTS

JP           2001-99889 A        4/2001

* cited by examiner

*Primary Examiner*—Minh N. Tang
(74) *Attorney, Agent, or Firm*—Morgan, Lewis & Bockius LLP

(57) ABSTRACT

In a jig for inspecting a device provided with at least a radio frequency signal terminal and an earth terminal, a metal block is formed with a through hole extending in a first direction. A contact probe is inserted into the through hole. The contact probe is provided with a metal pipe extending in the first direction. A plunger is retractably projected from one longitudinal end of the metal pipe to be brought into contact with the radio frequency signal terminal. At least two dielectric ring members are provided on an outer periphery of the metal pipe, and fitted with the through hole while forming a gap between the outer periphery of the metal pipe and an inner wall of the through hole, in order to form a coaxial path in which the contact probe serves as a core conductor and the metal block serves as an external conductor. A diameter of the through hole and a diameter of the dielectric ring members are selected such that the coaxial path has a predetermined impedance relative to the radio signal frequency terminal.

5 Claims, 3 Drawing Sheets

INSPECTION JIG FOR RADIO FREQUENCY DEVICE, AND CONTACT PROBE INCORPORATED IN THE JIG

BACKGROUND OF THE INVENTION

The present invention is related to an inspection jig and a contact probe incorporated in the jig, which firmly connect an inspection apparatus to an inspected device in a case where an electric characteristic of this device is inspected before the device is assembled on a circuit board. The inspected device corresponds to either a module or an IC (integrated circuit) of a high frequency/high-speed circuit such as, for instance, an amplifier circuit, a mixer circuit, and a filter circuit, which are assembled in a cellular phone.

In this specification, the above-described high frequency circuit is defined as such an analog circuit operable in a high frequency range, and the above-described high-speed circuit is defined as such a digital circuit in which a pulse width and a pulse interval of a digital signal are very short, and further, both the analog high frequency circuit and the digital high-speed circuit will also be referred to as an RF (radio frequency) circuit or device. The RF signal involves either a sine wave signal, or a pulse signal, the repetition period of which is higher than, or equal to 1 GHz.

In a case where electric characteristics of RF devices such as semiconductor wafers, ICs, and modules are inspected, in particular, if contact conditions of terminal portions are not sufficiently established, then impedances or the like are changed, so that measurement values are varied. Therefore, the electric characteristics of the RF devices are inspected by way of a jig shown in FIG. 4 as disclosed in Japanese Patent Publication No. 2001-99889A.

Specifically, an RF circuit corresponding to the inspected device is arranged as a module 20 in which an amplifier circuit, a mixer circuit, or the like are assembled within a housing made of a metal material in order to avoid external. The module 20 is constituted by employing input/output terminals 21/24 for inputting/outputting RF signals, a power supply terminal 22, a ground (earth) terminal 23, or the like on a surface of this metal housing. Then, such an inspection method is employed so as to inspect the RF circuit in such a manner that these terminals 21, 22, 23, 24 are electrically connected to respective terminals of a wiring board 36 on which wiring lines for inspection have been formed.

In the above inspection jig, it is employed a contact probe in which a plunger and a spring are inserted into a metal pipe such that a tip end of the plunger is retractably projected from the pipe by the urging force of the spring. A contact probe 33 for RF signal, a contact probe 34 for power supply, and a contact probe 35 for ground are stored within a metal block 31 capable of preventing an adverse influence caused by noise. These contact probes 33, 34, 35 are electrically made in contact with the respective terminals 22/23 and input/output terminals 21/24.

This contact probe 33 for RF signal is made of a short-length probe so as to decrease an inductance component. Even when this contact probe 33 for RF signal employs such a short probe, the inductance component of this short contact probe 33 cannot be neglected in the RF range. For example, as to a contact probe for RF signal having an inductance value of 1 nH, an impedance of this 1 nH—contact probe becomes 63 Ohms (Ω) in the frequency range of 10 GHz. To avoid such a problem, while a dielectric tube is inserted between the contact probe 33 for RF signal and the metal block 31, a coaxial line structure is formed in such a way that the contact probe 33 for RF signal is set as a core conductor and the metal block 31 is set as an external conductor. As a result, this coaxial line structure may prevent the increase of the impedance, and/or may avoid the penetration of the noise. In FIG. 4, reference numeral 37 shows a coaxial cable, and reference numeral 38 represents a plate for fixing the metal pipe provided as an outer periphery of the contact probe 33.

In the inspection jig shown in FIG. 4, two sets (input and output purposes) of the contact probes 33 for RF signals are illustrated, and one set of the contact probe 34 for power supply and also one set of contact probe 35 for ground are illustrated. However, in actual inspection jigs, large members of these contact probes are formed. Moreover, in the specific case, there are some cases that approximately 400 pieces per 1 cm$^2$ of terminals are provided in conjunction with recent higher integrations such as ICs. Therefore, such narrower pitches (about 0.4 mm) of the respective terminals appear in the field.

When terminal pitches become such narrower pitches, an outer diameter of a contact probe for RF signal, which involves a dielectric layer, must be made narrow. However, this outer diameter must be matched with such a characteristic impedance (for example, 50 Ω) which satisfies a relationship (1) between a diameter "d" of a core conductor of a coaxial line path and an inner diameter "D" of an outer conductor thereof, assuming now that a dielectric constant of a dielectric substance between the core conductor and the external conductor is defined as "$\varepsilon_r$".

$$Z_0(\Omega) = \frac{138.15}{\sqrt{\varepsilon_r}} \log_{10} \frac{D}{d} \quad (1)$$

In order to satisfy this formula (1), since a material whose dielectric constant is small is employed as a dielectric substance, the inner diameter "D" of the outer conductor can be decreased. However, even when a tube made of polytetrafluoroethlene is employed, and also a contact probe having the narrowest outer diameter (=0.15 mm) is employed so as to satisfy this formula (1), an inner diameter of an outer conductor (namely, inner diameter of through hole formed in metal block) becomes approximately 0.5 mm in order that a characteristic impedance of a coaxial line path becomes 50Ω. As a result, this inner diameter of the outer conductor cannot be fitted to the pitch of 0.4 mm. The above-described tube made of polytetrafluoroethlene, the dielectric constant of which is equal to 2.1, is presently known as such a dielectric substance having the smallest dielectric constant.

As a consequence, in order to simply make an outer diameter narrower, a diameter of a core conductor is required to be made smaller, and an outer diameter of a contact probe must be made narrower, for example, about 0.09 mm (in this case, inner diameter "D" becomes 0.3 mm). In order to narrow a contact probe having a complex structure, there are such problems that very high cost is required, durability of the contact probe is lowered, and reliability of this contact probe is decreased.

SUMMARY OF THE INVENTION

It is therefore an object of the invention to provide an inspection jig for an RF device, capable of performing a highly reliable inspection without being adversely influenced by noise, while employing a contact probe having a coaxial structure and manufactured in lower cost, even in such a case that a recent RF device having a very narrow pitch (interval) of terminals.

In order to achieve the above object, according to the invention, there is provided a jig for inspecting a device provided with at least a radio frequency signal terminal and an earth terminal, the jig comprising:

a metal block, formed with a through hole extending in a first direction; and a contact probe, inserted into the through hole, the contact probe comprising:

a metal pipe, extending in the first direction;

a plunger, retractably projected from one longitudinal end of the metal pipe to be brought into contact with the radio frequency signal terminal; and at least two dielectric ring members, provided on an outer periphery of the metal pipe, and fitted with the through hole while forming a gap between the outer periphery of the metal pipe and an inner wall of the through hole, in order to form a coaxial path in which the contact probe serves as a core conductor and the metal block serves as an external conductor, wherein a diameter of the through hole and a diameter of the dielectric ring members are selected such that the coaxial path has a predetermined impedance relative to the radio signal frequency terminal.

Preferably, a dimension in the first direction of each of the dielectric ring members is sufficiently smaller than a length of the metal pipe in the first direction.

In the above configuration, since a major portion of the contact probe along the first direction becomes an air layer between this contact probe and the metal block, the dielectric constant "$\in_r$" of the dielectric member defined in the above-explained formula (1) may be regarded as substantially 1. As a result, even when the diameter "d" of the core conductor is not decreased, since this dielectric constant "$\in_r$" becomes small, the inner diameter "D" of the external conductor can be reduced. Therefore, the invention can be properly adapted to such a need for narrowing pitches between the terminals of the inspected devices. For instance, even when the related-art contact probe having the outer diameter "d"=0.15 mmφ is employed, the inner diameter "D" of the outer conductor may be set to be approximately 0.35 mmφ, which may be properly adapted to the terminal interval of 0.4 mm.

Preferably, the dielectric ring members are comprised of a resin material and integrally molded with the metal pipe. In this case, the dielectric ring members will not be moved when the contact probe is fitted into the through hole. Therefore, the assembling operation can be facilitated and performed safely. It is more preferable that the dielectric members are integrally molded on recessed portions formed on the outer periphery of the metal pipe.

Preferably, the jig further comprises a conductive rubber sheet, in which metal filaments are arranged so as to extend in the first direction, and on which the earth terminal of the device to be inspected is brought into contact, so that the earth terminal and the metal block are electrically connected via the metal filaments.

In such a configuration, the connection between the earth terminal of the inspected device and the metal block can be firmly established over a wide area. Furthermore, since the metal filament connected to the metal block is located between the metal block and the inspected device, there is substantially no electric gap. Therefore, no signal is leaked between the RF input/output terminals, and the isolation characteristic in the inspection can be improved.

According to the invention, there is also provided a contact probe, inserted into a through hole formed in a metal block of a jig for inspecting a device provided with at least a radio frequency signal terminal and an earth terminal, the contact probe comprising:

a metal pipe;

a plunger, retractably projected from one longitudinal end of the metal pipe to be brought into contact with the radio frequency signal terminal; and at least two dielectric ring members, provided on an outer periphery of the metal pipe, and fitted with the through hole while forming a gap between the outer periphery of the metal pipe and an inner wall of the through hole, in order to form a coaxial path in which the contact probe serves as a core conductor and the metal block serves as an external conductor, wherein a diameter of the dielectric ring members is selected such that the coaxial path has a predetermined impedance relative to the radio signal frequency terminal, based on a diameter of the through hole.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE INVENTION

Figure 1A:
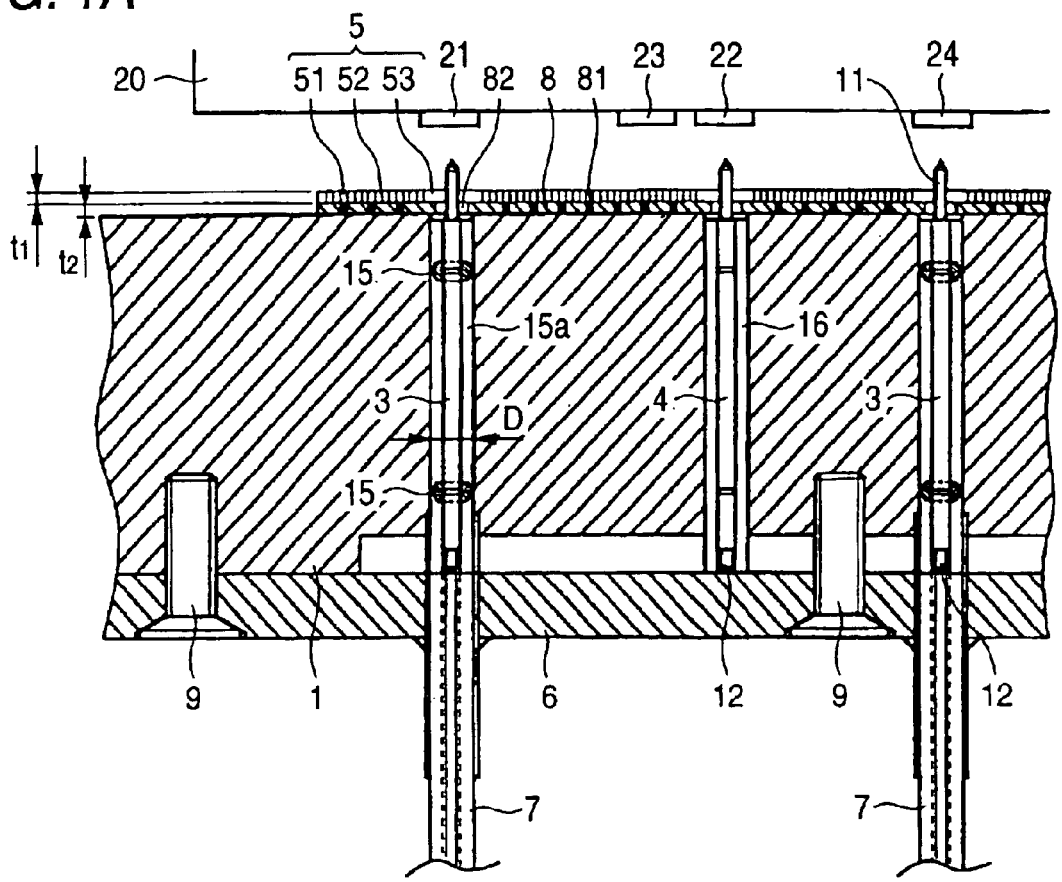
FIG. 1A is a section view of an inspection jig according to one embodiment of the invention.

Preferred embodiments of the invention will be described below in detail with reference to the accompanying drawings.

As shown in FIG. 1, in an inspection jig for an RF device according to one embodiment of the invention, a contact probe 3 for RF signal is provided in a metal block 1 in such a manner that a tip portion of a retractable plunger 11 is projected from the side of one face of the metal block 1. An inspected device 20 on which an RF circuit has been formed is depressed toward the metal block 1, so that RF signal terminals 21 and 24 of this inspected device 20 are made in contact with the contact probe 3. The electric inspection of the device 20 is carried out by an inspecting circuit which is connected to the other end of the contact probe 3 via a coaxial cable 7.

In this embodiment, dielectric rings 15 are fixed on at least two places of an outer periphery of the contact probe 3, and are fitted into a through hole of the metal block 1, so that a hollow portion 15a is formed between the contact probe 3 and the metal block 1. An outer diameter of the dielectric ring 15 is set so as to establish a desired characteristic impedance of a coaxial ling path in which the contact probe 3 serves as a core conductor and the metal block 1 serves as an external conductor.

Figure 3:
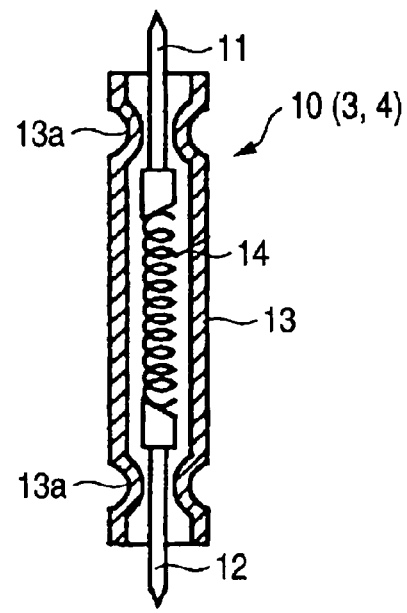
FIG. 3 is a section view of the contact probe, showing a state that dielectric rings are not provided.

FIG. 3 shows a structure of a general-purpose contact probe 10 (3, 4) with which the dielectric ring 15 is not equipped.

In the contact probe 10 (3, 4), a spring 14, and one ends of plungers 11, 12 are stored in a metal pipe 13 formed with narrowed portions 13a which cause the plungers 11 and 13 not to be ejected from the metal pipe 13. The plungers 11, 12 are urged outward by the spring 14 such that the tip portions of the plungers 11, 12 projected from the metal pipe 13 are made retractable. In a case where no force is applied to the plungers 11 12, the tip portion of the plunger 11 is projected from the metal pipe 13 by approximately 1 mm.

In this embodiment, the plungers 11, 12 are provided at both edges. However, the plunger may be provided at least one end of a contact probe 10 confronting the inspected device 20. For example, the other end of the contact probe 10 may be fixed with another member by soldering.

The detailed configuration of the contact probe 10 will be described with reference to FIG. 1B. A length "$L_1$" of the metal pipe 13 is selected to be approximately 3.5 mm. An outer diameter "d" of the metal pipe 13 is selected to be approximately 0.15 mm. The metal pipe 13 is made of nickel silver (copper/nickel/zinc alloy). The plungers 11, 12 are made of either an SK material (carbon steel) or beryllium copper. Thicknesses of the plungers 11, 12 are selected to be approximately 0.1 mm. Projected lengths "$L_2$" of the plunger 11 from the end of the metal pipe 13 are made by approximately 1 mm. The spring 14 is formed by a piano wire, or the like.

With respect to the contact probe 3 for RF signal, molding resin is integrally formed on the outer periphery of the contact probe 10, so that the dielectric ring 15 is formed. This dielectric ring 15 has an outer diameter "$d_2$" is selected to be 0.34 mm$\phi$ and a length "$L_3$" thereof is selected to be approximately 0.4 mm, in a case where an inner diameter "D" of a through hole formed in the metal block 1 is selected to be 0.33 mm$\phi$. The dielectric ring 15 is fitted the through hole to be fixed therein.

The outer diameter of this dielectric ring 15 is determined so as to have a dimension larger than the inner diameter "D" by 0.1 to 0.2 mm. The inner diameter "D" of the metal block 1 is determined by the outer diameter "d" of the contact probe 3 and the dielectric constant of the dielectric ring 15 corresponding to a dimension ratio relative to the hollow portion 15a, based upon the above-explained formula (1). Here, the dielectric constant of the dielectric ring 15 can be substantially regarded as 1, in a case where the length "$L_3$" of the dielectric ring 15 is sufficiently smaller than the length "$L_1$" of the metal pipe 13.

Figure 1B:
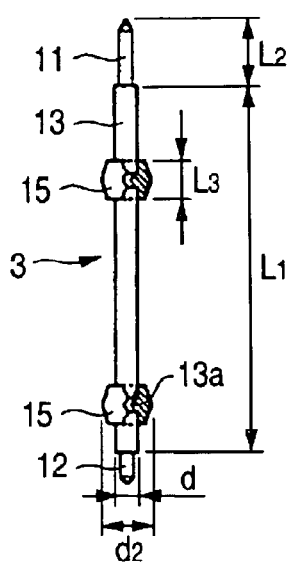
FIG. 1B is an explanatory view of a contact probe incorporated in the inspection jig.

In order to facilitate the insertion of the dielectric ring 15 into the through hole of the metal block 1, it is preferable that a center portion of each dielectric ring 15 in the length direction thereof is made sharp as shown in FIGS. 1A and 1B. However, the outer diameter of the dielectric ring 15 may be made equal entirely in the length direction.

Although it is sufficient to provide one piece of the dielectric ring 15 on each of both end portions of the contact probe 3, the number of the dielectric rings 15 may be increased if the length of the dielectric ring 15 is long. However, it is preferable to suppress the number of these dielectric rings 15 in view of such a technical aspect that the dielectric constants of the dielectric substances may be decreased. As to the resin material, such a resin as polypropylene (PP) whose dielectric constant is small may be employed.

Furthermore, as indicated in FIG. 1B, since this dielectric ring 15 is integrally molded on the narrowed portion (concave portion) 13a of the contact probe 10, this dielectric ring 15 is not moved when the dielectric ring 15 is fitted into the through hole of the metal block 1.

To obtain the contact probe 3 as described the above, the contact probe 10 having the structure shown in FIG. 3 is firstly formed. Next, the contact probe 10 is set into a mold where the concave portion confronting the narrowed portion 13a has been formed, and molten resin is then poured into the mold After this molten resin is cooled to solidify, this assembly is taken out from the mold. The contact probe 3 provided with the dielectric rings 15 may be mass-produced in the simple manner.

Figure 2A:
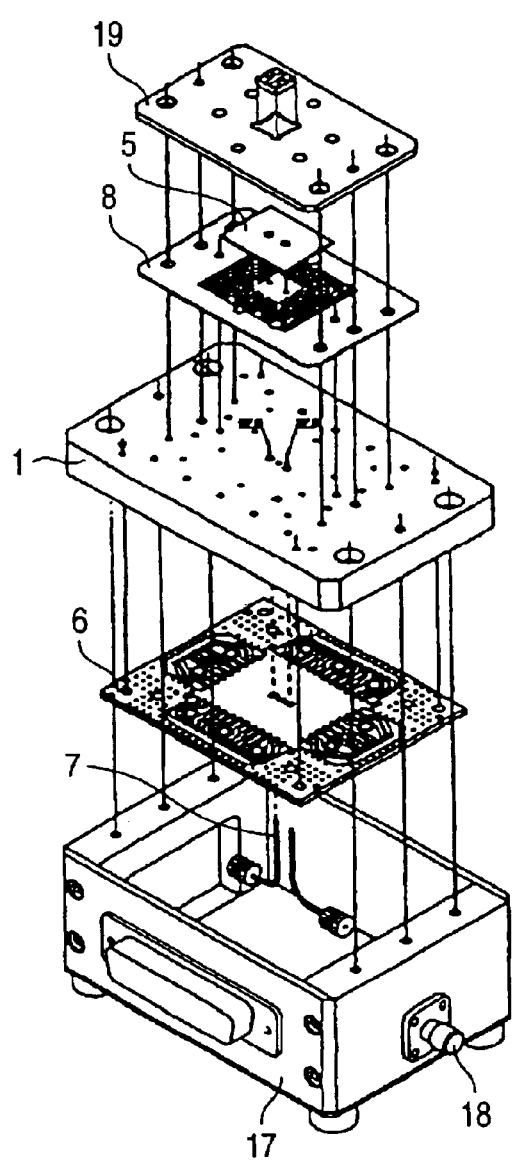
FIG. 2A is a perspective view showing a disassembled state of the inspection jig.
Figure 2B:
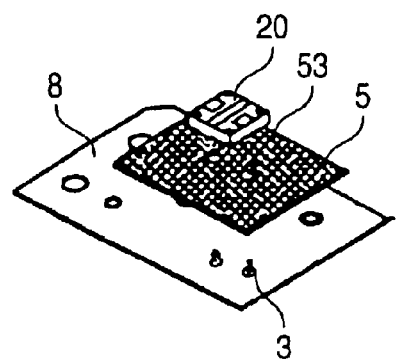
FIG. 2B is an enlarged perspective view showing a disassembled state of a GND board and a conductive rubber sheet in the inspection jig.

The other end of the contact probe 3 is connected to a coaxial cable 7 such as a semi-rigid cable. As shown in FIG. 2A, this coaxial cable 7 is connected to an SMA (Sub Miniature Type-A) connector 18 which is provided in a wiring box 17 made of a metal plate, for example, aluminum. A not-shown tester may be connected to the SMA connector 18 via a coaxial cable.

The contact probe 4 for power supply terminal need not be formed in a coaxial structure, but may be held via an insulating member 16 in such a manner that this contact probe 4 may be electrically insulated with respect to the metal block 1. If a dielectric substance having a desirable thickness and a large dielectric constant is formed so as to establish a desirable capacitance between this contact probe 4 and the metal block 1, high frequency noise which is superimposed on the power supply line can be eliminated. As shown in FIG. 1A, the respective contact probes 3 and 4 are designed not to be vertically moved in such a manner that the lower ends thereof are fixed by the wiring board 6, and the upper ends thereof are fixed by way of through holes of a GND board 8 (will be explained later), and also such a portion that a GND electrode is not formed (will be discussed later).

Figure 4:
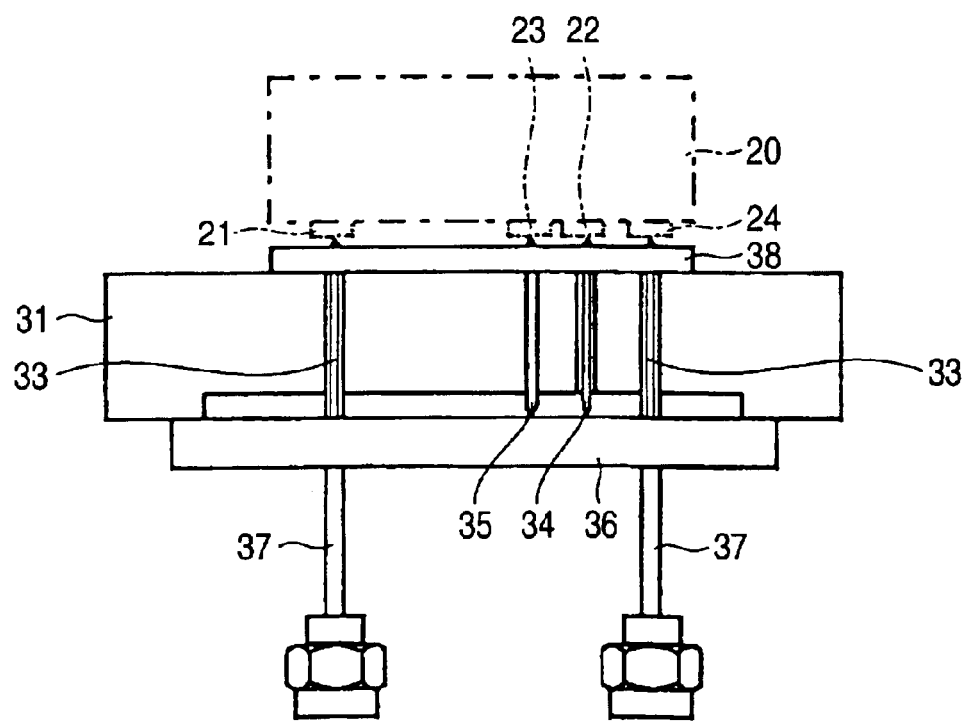
FIG. 4 is an explanatory view of a related-art inspection jig.

As shown in FIG. 1A, an earth (ground) terminal 23 of the inspected device 20 is connected to the metal block 1 via both the GND board 8 and an conductive rubber sheet 5. Since such a structure is employed, a contact area between the earth terminal 23 and the metal block 1 can be made several tens larger than that achieved by employing the above-described contact probe for earth shown in FIG. 4. However, the earth terminal 23 may be connected by way of the related-art contact probe.

The GND board 8 which fixes the upper ends of both the contact probes 3 and 4 is provided on the metal block 1, so that only the plunger 11 is projected upwardly from the GND board 8 by the spring 14. A thickness "$t_2$" of this GND board 8 is selected to be approximately 0.25 mm, so that this plunger 11 is projected by approximately 0.45 mm above the conductive rubber sheet 5 which is provided on this GND board 8 (will be discussed later) in a case where the plunger 11 is not depressed by the inspected device 20.

Figure 2C:
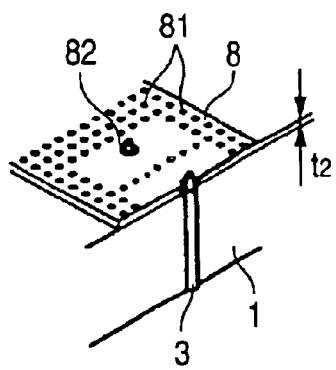
FIG. 2C is an enlarged perspective view of the GND board.

As shown in FIG. 2C, the GND board 8 is made of for example, a glass epoxy board formed with through holes having dimensions of approximately 0.3 mm$\phi$ in a matrix manner at an interval of approximately 1 mm. Vias 81 are formed in these through holes by way of a plating manner so as to electrically connect an upper face and a lower face of the GND board 8 therethrough. A metal film is formed on almost entire of the upper and lower faces of the GND board 8 so as to avoid the terminals 21, 22 and 24. Thereby the metal film serves as a GND electrode for electrically connecting the metal block 1 and metal filaments formed in the conductive rubber sheet 5 (will be described later). To establish excellent electrical connection, it is preferable that the metal film and the vias 81 are plated with gold.

As shown in FIGS. 1A and 2C, the GND board 8 is formed with through holes 82 each having a smaller diameter than the outer diameter of the metal pipe. The through holes 82 are formed at positions confronting the contact probes 3, 4 such that the plungers 11 are allowed to pass through. The upper end of the metal pipe 13 is fixed by a vicinity of the through hole 82 of this GND board 8. Therefore, in order to avoid the short-circuit between the metal pipe 13 and the metal block 1, the above described GND electrode and the vias 81 are not formed in the vicinity of the through hole 82 (see FIG. 2C). The GND board 8 is fixed to the metal block 1 by employing a screw (not shown).

Even when an abnormal condition happens to occur in any one of the contact probes 3 and 4, and/or even in such a case that a foreign matter is entered into a space between these contact probes 3 and 4, by merely removing the GND board 8, the relevant contact probe may be easily replaced by a new contact probe, or the foreign matter may be removed so as to repair the inspection jig. However, this GND board 8 may be eliminated so long as the contact probes 3 and 4 can be fixed.

As shown in FIG. 1A, the conductive rubber sheet 5 comprises: an insulating material 51 such as elastic rubber; and a large number of metal filaments 52 such as gold filaments or copper filaments plated with gold which are embedded in the insulating material 51. Specifically, a thickness "$t_1$" of the insulating material 51 is approximately 0.3 mm, and the metal filaments 52 are arranged with a pitch of approximately 30 to 50 $\mu$m in a matrix manner. Accordingly, upper and lower faces of the rubber sheet 5 is electrically connected via the metal filaments 52, but insulation is established in the lateral direction of the rubber sheet 5 by the insulating material 51 existing between the metal filaments 52. The thickness of the conductive rubber sheet 5 may be selected as approximately 0.2 to 1 mm in view of the purpose.

The conductive rubber sheet 5 is formed with through holes 53 at portions to be confronted with the contact probes 3, 4 while avoiding the plungers 11 and the terminals 21, 22 and 24 of the inspected device 20. However, the through holes 53 may not necessarily avoid the terminals 21, 22 and 24 so long as the movement of the plungers 11 are not disturbed. As described the above, since the insulation in the lateral direction of the rubber sheet 5 is established, the short-circuit between the terminals 21, 22 and 24 will not be occurred if the above mentioned insulating measure in the GND board 8 is surely established.

Assuming now that the dimension of the earth terminal 23 of the inspected device 20 shown in FIG. 1A is selected to be approximately 0.3 mm square, and that the metal filaments 52 of the conductive rubber sheet 5 are arranged at an interval of approximately 50 $\mu$m, a total number of the metal filaments 52 which are present within the area of the earth terminal 23 becomes 36 filaments. According to the elasticity, all the filaments 52 confronting the earth terminal 23 can be brought into contact with the earth terminal 23, upon the depression of the inspected device 20 toward the inspection jig. Therefore, it is possible to secure a considerably larger contact area than the configuration shown in FIG. 4 in which only a tip end of the contact probe 35 is brought into point contact with the earth terminal 23.

Further, since the metal filaments 52 are electrically connected with the metal block 1 at portions between the terminals 21, 22 and 24, leakages of RF signals can be prevented, and isolation established between the input side and the output side can be improved.

At least a portion of the outer peripheries of the contact probes 3, 4 may be held by the metal block 1 formed from a metal plate via an insulating material, so that a coaxial line path may be readily formed and/or a capacitor capable of short-circuiting high frequency noise may be asily formed.

The wiring board 6 is used to apply electric power to the inspected device 20. While wiring lines are formed on a board, terminals of these wiring lines are formed at places corresponding to the terminals of the inspected device 20 in a proper manner. In this case, when the inspected device 20 corresponds to an amplifier, a chip capacitor, or the like are connected between the power supply terminal and the earth terminal on the wiring board 6. Otherwise, a dielectric material having a large dielectric constant is inserted around the contact probe 4 for power supply terminal in order to form a capacitor, so that noise can be eliminated. This wiring board 6 is fixed on the metal block 1 by using, for example, a screw 9 as shown in FIG. 1A In this embodiment, the coaxial cable 7 is directly connected to the other end of the contact probe 3. However, the contact probe 3 may be directly connected to the wiring board 6, and the coaxial cable 7 may be connected to the wiring board 6.

In a case where an inspected device is constituted only by a passive circuit which requires no electric power, no longer such a power supply electric terminal is required, and thus, such a wiring board 6 is not required. However, it is preferable that a board member for supporting the contact probe 3.

An inspection is carried out while the inspected device 20 is depressed on the jig in which the wiring board 6, the metal block 1, the GND board 8, and the conductive rubber sheet 5 are assembled as shown in FIG. 2A. Since the inspected device 20 is depressed via a work guide 19 made of acrylic resin by employing a depressing mechanism (not shown), this device 20 may be surely depressed while the positions of the contact pins 3 and 4 are precisely located to the positions of the respective terminals of the inspected device 20. Thus, both the terminal for RF signal may be firmly made in contact with the power supply terminal via the contact probe, and the earth terminal may be connected via the conductive rubber sheet 5 with a wide contact area.

In accordance with the inspection jig of the present invention, the dielectric ring 15 is held in the metal block 1 via the dielectric ring 15, and the hollow portion 15a formed between the contact probe 3 and the metal block 1 serves as the dielectric member of the coaxial line path thus constructed. Since the dielectric constant of this dielectric member can be decreased, the inner diameter "D" of the external conductor (metal block 1) can be reduced to approximately 0.35 mm$\phi$, while the contact probe 3 having the thickness "d" nearly equal to the conventional thickness of 0.15 mm$\phi$ is used as the core conductor. Therefore, even when such a currently-available inspected device is inspected in which a pitch between terminals is made very narrow, e.g., approximately 0.4 mm, and even when the contact probe for RF signal having the coaxial structure is employed, this device can be precisely inspected without extremely narrowing the contact probe.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A jig for inspecting a device provided with at least a radio frequency signal terminal and an earth terminal, the jig comprising:
    a metal block, formed with a through hole extending in a first direction; and
    a contact probe, inserted into the through hole, the contact probe comprising:
        a metal pipe, extending in the first direction;
        a plunger, retractably projected from one longitudinal end of the metal pipe to be brought into contact with the radio frequency signal terminal; and
        at least two dielectric ring members, provided on an outer periphery of the metal pipe, and fitted with the through hole while forming a gap between the outer periphery of the metal pipe and an inner wall of the through hole, in order to form a coaxial path in which the contact probe serves as a core conductor and the metal block serves as an external conductor,
    wherein a diameter of the through hole and a diameter of the dielectric ring members are selected such that the coaxial path has a predetermined impedance relative to the radio signal frequency terminal.

2. The jig as set forth in claim 1, wherein a dimension in the first direction of each of the dielectric ring members is sufficiently smaller than a length of the metal pipe in the first direction.

3. The jig as set forth in claim 1, wherein the dielectric ring members are comprised of a resin material and integrally molded with the metal pipe.

4. The jig as set forth in claim 1, further comprising a conductive rubber sheet, in which metal filaments are arranged so as to extend in the first direction, and on which the earth terminal of the device to be inspected is brought into contact, so that the earth terminal and the metal block are electrically connected via the metal filaments.

5. A contact probe, inserted into a through hole formed in a metal block of a jig for inspecting a device provided with at least a radio frequency signal terminal and an earth terminal, the contact probe comprising:
    a metal pipe;
    a plunger, retractably projected from one longitudinal end of the metal pipe to be brought into contact with the radio frequency signal terminal; and
    at least two dielectric ring members, provided on an outer periphery of the metal pipe, and fitted with the through hole while forming a gap between the outer periphery of the metal pipe and an inner wall of the through hole, in order to form a coaxial path in which the contact probe serves as a core conductor and the metal block serves as an external conductor,
    wherein a diameter of the dielectric ring members is selected such that the coaxial path has a predetermined impedance relative to the radio signal frequency terminal, based on a diameter of the through hole.

* * * * *